United States Patent [19]

Sekiguchi et al.

[11] Patent Number: 4,896,328
[45] Date of Patent: Jan. 23, 1990

[54] RIDGE WAVEGUIDE-TYPE SEMICONDUCTOR LASER HAVING A CURRENT RECOMBINATION LAYER AND AN OPTICAL WAVEGUIDE LAYER

[75] Inventors: Yoshinobu Sekiguchi, Yamato; Sotomitsu Ikeda, Atsugi, both of Japan

[73] Assignee: Canon Kabushiki Kaisha, Tokyo, Japan

[21] Appl. No.: 284,602

[22] Filed: Dec. 15, 1988

[30] Foreign Application Priority Data

Dec. 28, 1987 [JP] Japan ................. 62-335729

[51] Int. Cl.⁴ .............................. H01S 3/19
[52] U.S. Cl. ...................... 372/45; 372/46; 357/17
[58] Field of Search ................. 372/44–46, 372/98, 108; 357/16, 17

[56] References Cited

U.S. PATENT DOCUMENTS

| 4,084,130 | 4/1978 | Holton ................. 372/45 |
| 4,142,160 | 2/1979 | Tsukada et al. ................. 372/46 |
| 4,694,460 | 9/1987 | Hayakawa et al. ................. 372/45 |
| 4,794,611 | 12/1988 | Hara et al. ................. 372/45 |
| 4,796,067 | 1/1989 | Shimizu et al. ................. 357/4 |
| 4,799,229 | 1/1989 | Miyazawa et al. ................. 372/50 |
| 4,829,534 | 5/1989 | Miyazawa et al. ................. 372/46 |

FOREIGN PATENT DOCUMENTS

| 0069793 | 4/1982 | Japan ................. 372/45 |
| 0218187 | 12/1983 | Japan ................. 372/45 |

Primary Examiner—William L. Sikes
Assistant Examiner—Georgia Y. Epps
Attorney, Agent, or Firm—Fitzpatrick, Cella, Harper & Scinto

[57] ABSTRACT

A ridge waveguide-type semiconductor laser comprises a current recombination layer which generates light, and an optical waveguide layer to which the light generated at the recombination layer is coupled. A belt-like projection is formed by etching at least a part of the optical waveguide layer in the direction of its thickness at both opposing side regions up to a central region in the direction of the width of the laser.

22 Claims, 7 Drawing Sheets 4,896,328

RIDGE WAVEGUIDE-TYPE SEMICONDUCTOR LASER HAVING A CURRENT RECOMBINATION LAYER AND AN OPTICAL WAVEGUIDE LAYER

BACKGROUND OF THE INVENTION

1. Field of the Invention

This invention relates to a semiconductor laser which emits laser light by injecting current, and more particularly relates to a ridge waveguide-type semiconductor laser having a current recombination layer (an active layer) on which a belt-like projection extending in the direction of laser resonance is formed.

2. Description of the Prior Art

Heretofore, mesa-etching processing for forming a ridge waveguide of a ridge waveguide-type laser has usually been performed, as dislosed in U.S. Pat. No. 4,142,160, for example, by removing semiconductor layers laminated on an active layer to a depth just reaching or adjacent to the active layer.

In such a conventional process, when the etched depth is relatively shallow, and the distance $X_R$ between the upper surface of the etched regions at the both sides of the ridge and the upper surface of the active layer is no less than 0.2 $\mu$m, a gain guide-type semiconductor laser is obtained, since the difference in effective refractive index between the ridge waveguide region and the exterior thereof is small. Consequently, the laser has characteristics such that the threshold current is relatively large, the spread angle ($\theta \parallel$) of the far field pattern (FFP) in the horizontal direction is small, astigmatism (AS) is large or the like. Now, when $X_R$ is no more than 0.2 $\mu$m by increasing the etching depth, a laser having a large refractive index guide effect is obtained, and thus the spread angle in the horizontal direction and astigmatism are improved.

When the etching depth is increased as described above, however, damage caused by the processing reaches the active layer. Hence, an increase of threshold current, a decrease of quantum efficiency, a decrease of the device life or the like occur. There is also a problem that the variance $\Delta X$ due to the processing accuracy of the above-described $X_R$ largely influences several characteristics of the laser. This is because the change which $\Delta X$ causes in the effective refractive index is larger in the region where $X_R$ is small than in the region $X_R$ is large. That is, in order to produce a ridge waveguide-type laser having a large refractive index guide effect, a high processing accuracy of $\Delta X < 0.1$ $\mu$m is needed at $X_R \approx 0.1$–$0.2$ $\mu$m, and so production is difficult.

SUMMARY OF THE INVENTION

It is an object of the present invention to provide a semiconductor laser which has a large refractive index guide effect, and yet shows little deterioration of characteristics due to processing damage.

The above-described object can be achieved with a semiconductor laser comprising:

a substrate;

a current recombination layer formed on the substrate, the recombination layer generating light by recombining injected current;

an optical waveguide layer formed on the recombination layer across a width of the recombination layer and having a layer thickness, the light generated at the recombination layer being coupled to the optical waveguide layer; and at least a part of said optical waveguide layer being removed by etching in the direction of the layer thickness, at two opposing side regions up to a center region in the direction of the width of the recombination layer, in order to form a belt-like projection; and a pair of electrodes for providing current to the recombination layer.

It is desirable that the recombination layer has a double-hetero structure or a multi-quantum-well (MQW) structure. In such case, the configuration, thickness and composition of each layer are controlled so that the optical waves propagating in the current recombination layer and the optical waveguide layer leak outside the layers, respectively, and are coupled to each other according to the electromagnetic wave theory.

That is, in the semiconductor laser of the present invention, the recombination layer is separated from the optical waveguide layer even when mesa processing has been deeply performed, and is sufficiently apart from the processed surface. Hence, it is not damaged by processing. Accordingly, a semiconductor laser can be obtained which has a large refractive index guide effect, and yet has no disadvantages such as the increase of threshold current, the decrease of quantum efficiency, the decrease of the device life or the like.

DESCRIPTION OF THE PREFERRED EMBODIMENTS

The embodiments of the present invention will be hereinafter explained in detail with reference to the drawings.

Figure 1A:
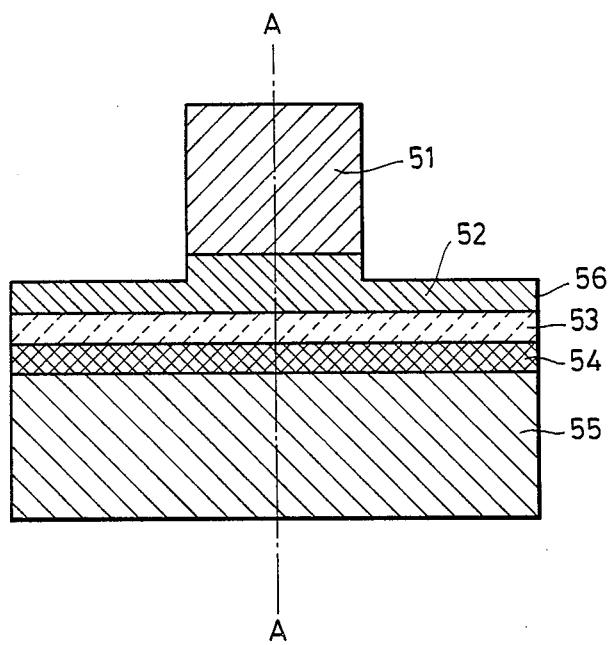
FIG. 1A is a cross-sectional view showing a principal part of an embodiment of a semiconductor laser of the present invention.

FIG. 1A is a corss-sectional view showing a principal part of the first embodiment of the present invention. The semiconductor laser device comprises laminated layers of, from top to bottom, an upper clad layer 51, a light-guide layer 52, a separation layer 53 for separating the light-guide layer 52 and a current recombination layer 54, the current recombination layer 54 and a lower clad layer 55. A p-n junction is formed in the current recombination layer 54 or in a hetero-interface adjacent to this layer. When current is injected into a semiconductor laser having this structure, the injected current is converted into light in the current recombination layer 54.

Figures 1B, 1C:
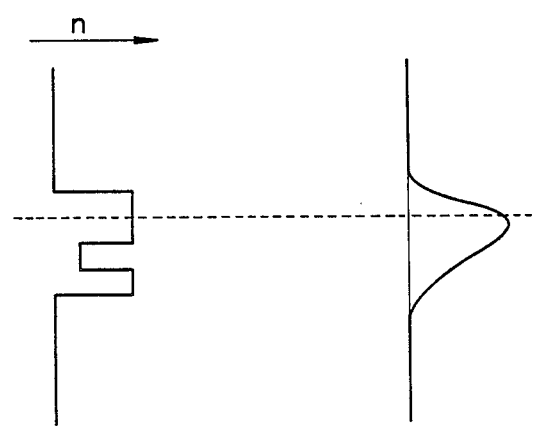
FIGS. 1B and 1C are diagrams showing the distribution of refractive index and light intensity, respectively, of the laser shown in FIG. 1.

On the other hand, refractive indices at the section A-A' of the semiconductor laser are formed, as shown in FIG. 1B, so that the current recombination layer 54 and the light-guide layer 52 have the same degree of refractive index, or the refractive index of the current recombination layer 54 is a little larger than that of the light-guide layer 52. At the same time the absorption of the light generated at the current recombination layer 54 in the light-guide layer 52 is small. Further, the confinement of light in the both layers is weak in the current recombination layer 54, and a little stronger in the light-guide layer 52. Consequently, the light generated in the current recombination layer 54 is transferred to the light-guide layer 52, and so the light intensity at the section has the distribution shown in FIG. 1C. The light-guide layer 52 has been partly mesa-etching processed in order to form the ridge waveguide, and there exists a difference in effective refractive index between within the ridge and outside the ridge. Hence, a refractive index guide-type semiconductor laser is obtained. However, the mesa-processed surface outside the ridge is sufficiently apart from the current recombination layer 54, and any damage during processing does not reach the current recombination layer 54.

Typical compositions and thicknesses of each layer when the present embodiment is realized using AlGaAs are as follows.

|  | Composition | Thickness |
| --- | --- | --- |
| Upper clad layer 51: | $Al_xGa_{1-x}As$ | ~1.5 μm |
| Lower clad layer 55: | $Al_xGa_{1-x}As$ | ~1.5 μm |
| Light-guide layer 52: | $Al_yGa_{1-y}As$ ($w \leq y$) | 0.2–1.0 μm |
| Separation layer 53: | $Al_zGa_{1-z}As$ ($y \leq z \leq x$) | 0.2–0.8 μm |
| Current recombination layer 54: | $Al_wGa_{1-w}As$ ($0 \leq w \leq y$) | 0.01–0.1 μm |

Figure 2:
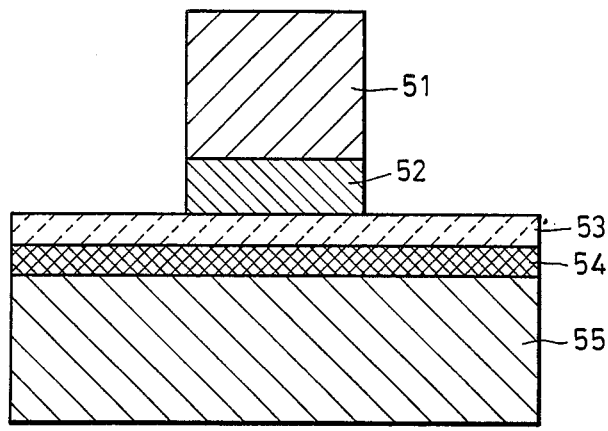
FIGS. 2 through 4 are cross-sectional views showing principal parts of other embodiments of the present invention.

FIG. 2 is a cross-sectional view showing a principal part of the second embodiment of the present invention, in which the light-guide layer outside the ridge is completely removed by mesa-processing in order to further increase the refractive index guide effect of the laser.

Figure 3:
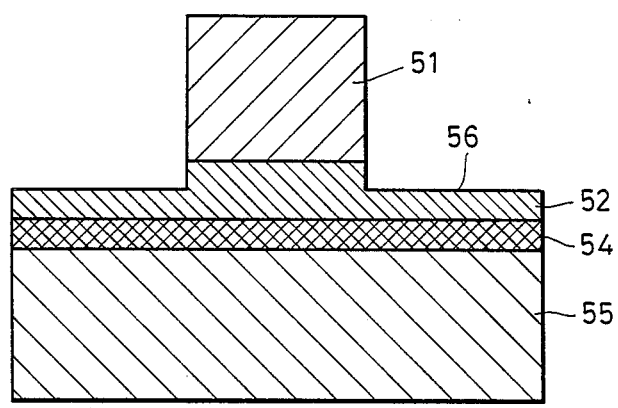

FIG. 3 is a cross-sectional view showing a principal part of the third embodiment of the present invention, in which the separation layer 53 for separating the current recombination layer 54 and the light-guide layer 52 is omitted. It is preferable to provide the separation layer 53, but this layer may be omitted as in the present embodiment.

Figure 4:
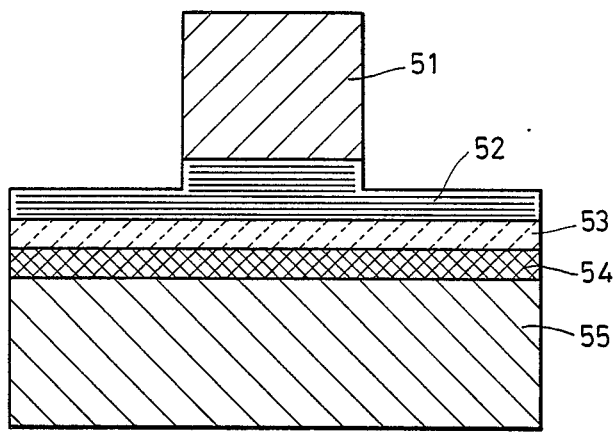

FIG. 4 illustrates the fourth embodiment of the present invention, in which the light-guide layer 52 is configured in a a super lattice structure provided with alternately laminated thin films of $Al_mGa_{1-m}As$ and $Al_nGa_{1-n}As$ ($0<m<n$), and optical loss is reduced.

It will be noted that in FIGS. 2 through 4, like components as in FIG. 1A are indicated by like numerals.

More concrete configurational examples of the laser of the present invention will be hereinafter explained.

Figure 5A:
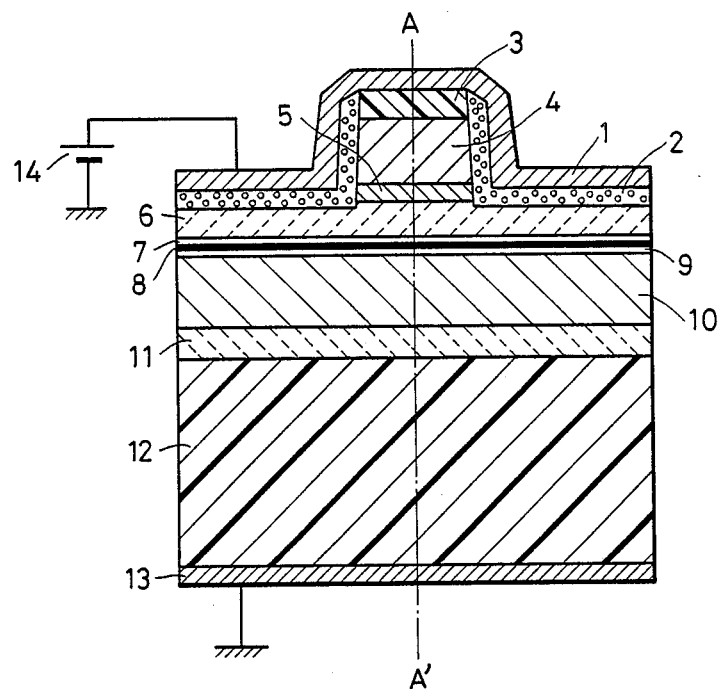
FIGS. 5A and 5B are a cross-sectional view and a perspective view, respectively, showing a concrete configuration of semiconductor laser of the present invention.
Figure 5B:
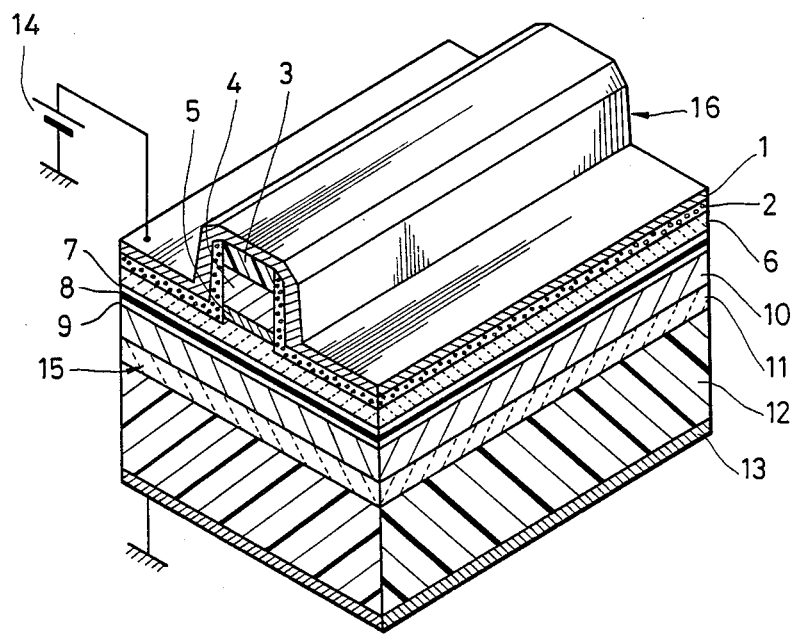

FIGS. 5A and 5B are a cross-sectional view and a perspective view, respectively, showing a configurational example of the present invention. This laser has an MQW structure for both the current recombination layer and the optical waveguide layer.

On an $n^+$-GaAs substrate 12, an $n^+$-GaAs buffer layer 11, an n-$Al_{0.5}Ga_{0.5}As$ clad layer 10, an $Al_xGa_{1-x}As$ light-confining layer 9, a recombination layer 8 having an MQW structure, an $Al_xGa_{1-x}As$ light-confining layer 7, a p-$Al_{0.5}Ga_{0.5}As$ clad layer 6, an optical waveguide layer 5 having an MQW structure, a p-$Al_{0.5}Ga_{0.5}As$ clad layer 4 and a $p^+$-GaAs cap layer 3 were successively laminated. Then, a mask was provided only on the center region where the ridge is to be formed on the layer 3, and the both sides thereof were removed by etching up to a midsection of the layer 5. Subsequently, the mask was removed.

After thus forming the ridge, an insulator film 2 of $SiO_2$, $Si_3N_4$ or the like was formed thereupon by CVD. The insulator film 2 was then removed only on the ridge, and a window for current injection was formed. Further, thereon and on the bottom side of the substrate, a p-side electrode 1 and an n-side electrode 13 were formed by Au films, respectively. Here, the recombination layer 8 consists of three cycles of wells (x=0, 30 Å in width) and barriers (x=0.35, 40 Å in width). At both sides thereof, there is a light-confining layer $Al_xGa_{1-x}As$, the mixed crystal ratio x of which is gradually changed within the range of x=0.5−0.3, so as to be smoothly connected to the clad layer and to the barrier layer of the active layer. The light-confining layer 7 is for improving the capture of carriers and strengthening the confinement of light, but is not substantially related to the present invention. The optical waveguide layer 5 consists of five cycles of wells (x=0, 30 Å in width) and barriers (x=0.5, 60 Å in width).

When current is injected in the laser thus formed from a power supply 14, laser light is emitted from laser resonant surfaces 15 and 16. In the case of this embodiment, the energy gap of the wells in the recombination layer is 1.60 eV, and the energy gap of the wells in the optical waveguide layer is 1.64 eV. Hence, the light having a wavelength of 785 μm generated in the recombination layer is guided while almost never being absorbed in the optical waveguide layer. It is known also that, in the MQW structure, when the width of the barrier is larger than about 50 Å, the effective refractive index becomes larger by 0.1–0.2 compared with the state of a mixed crystal. Hence, in the present embodiment, optimization has been performed in anticipation of the increase of refractive index as well.

In the present invention, the most effective film configuration is such that both the active layer and the optical waveguide layer have weak confinement of light, and are apart no less than 0.5 μm from each other. The lasers thus configured showed excellent characteristics.

Figure 6:
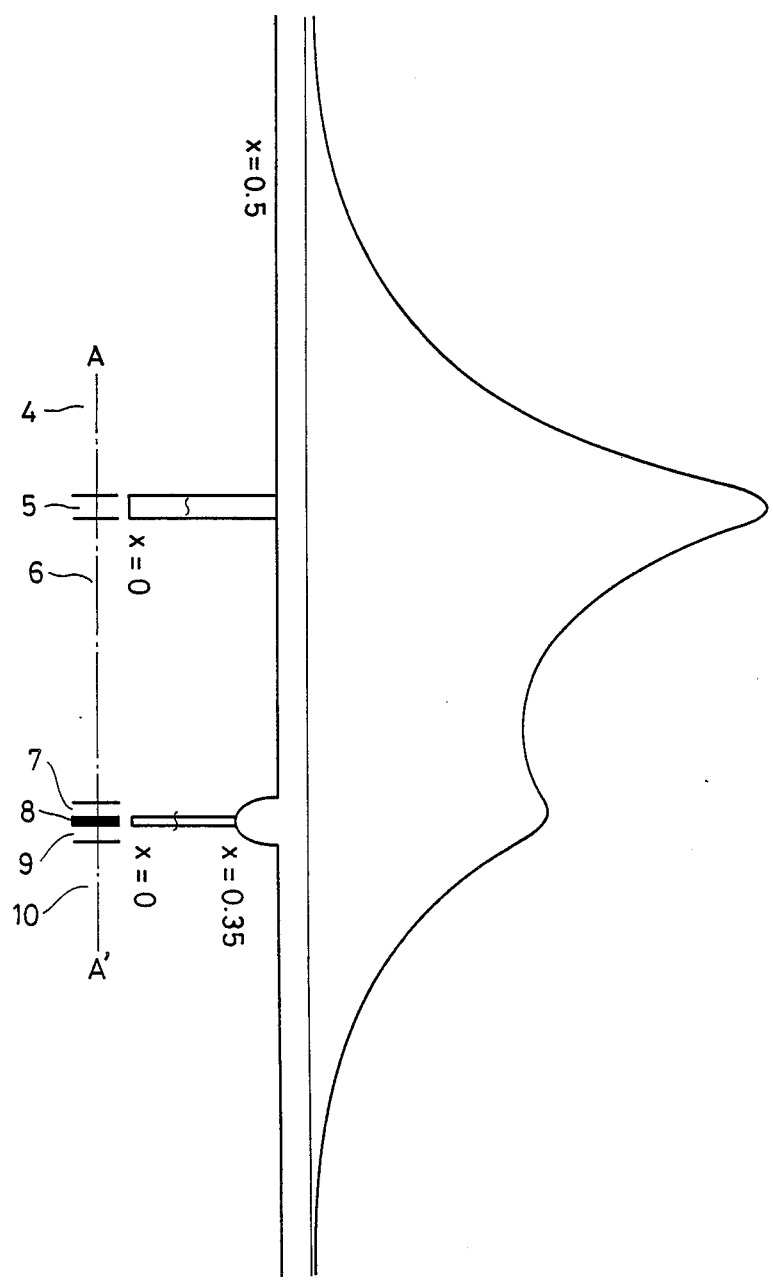
FIG. 6 is a diagram showing the distribution of the electric field in the direction of the film thickness at the ridge region of the laser shown in FIG. 5.

FIG. 6 is the result of theoretical calculation of the distribution of the electric field intensity of light near the active layer at the profile A-A' in the direction of the film thickness of the laser shown in FIG. 5A. The result has also experimentally been confirmed from the observation of the near field pattern. From FIG. 6, it can be understood that the light is effectively taken within the ridge.

When the light intensity is thus taken within the ridge, the difference in effective refractive index between the ridge region and outside the ridge becomes large. As a result, the confinement of light in the horizontal direction is improved, and the spread half-value full angle of light in the horizontal direction of the far field pattern (FFP) θ ∥ becomes a large value as shown in FIG. 7.

Figure 7:
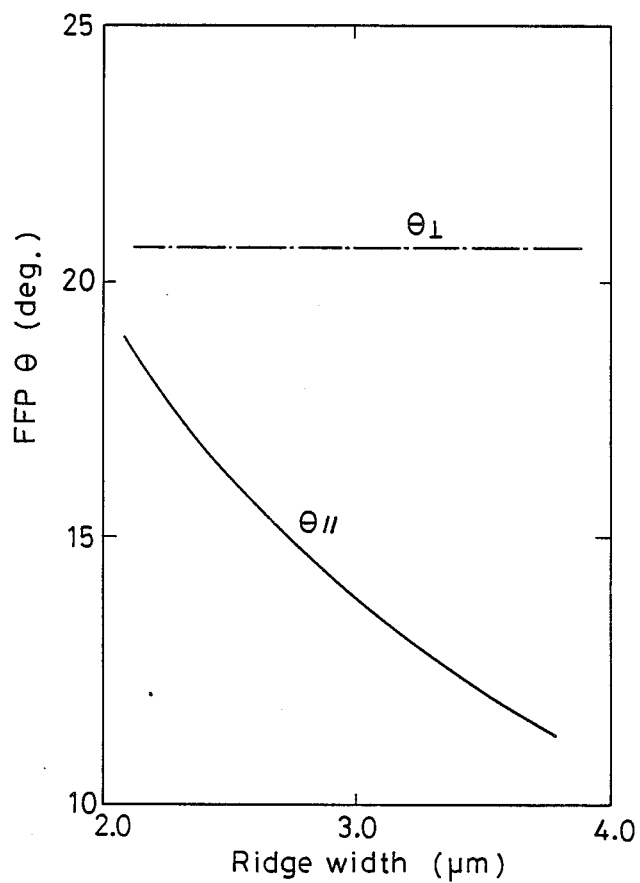
FIG. 7 is a diagram showing the relationship between the ridge width and the spread angle of the far field pattern in a laser of the present invention.

FIG. 7 shows the relationship between the half-value full angle of FFP and the ridge width. In the case of this embodiment, the spread angle θ⊥ in the vertical direction is as small as 20.7 deg. The spread angle θ ∥ in the horizontal direction strongly depends on the ridge width, i.e., it is 10 deg. at the ridge width of about 4 μm, but it becomes 20 deg. at the ridge width of about 2 μm, and thus a perfectly circular FFP is obtained. Moreover, since the light spreads gently within the semiconductor laser, and the density of the light intensity at the active layer is small, the limit of light output level is high, and it is possible to obtain a high output of no less than 100 mW.

In the case of the ridge waveguide-type semiconductor laser without the optical waveguide layer which was explained as the conventional technique, FFP $\theta \parallel$ does not depend so much on the ridge width when $x_R = 0.4$ μm, and is no more than 10 deg., and the result of $\theta \parallel > 15$ deg. is obtained when $x_R = 0.1$ μm. In this case, however, since the density of the light intensity becomes high at the interior, the limit of light output level decreases, and it is impossible to obtain a high output. As explained above, according to the present invention, it becomes possible to improve many characteristics.

Figure 8:
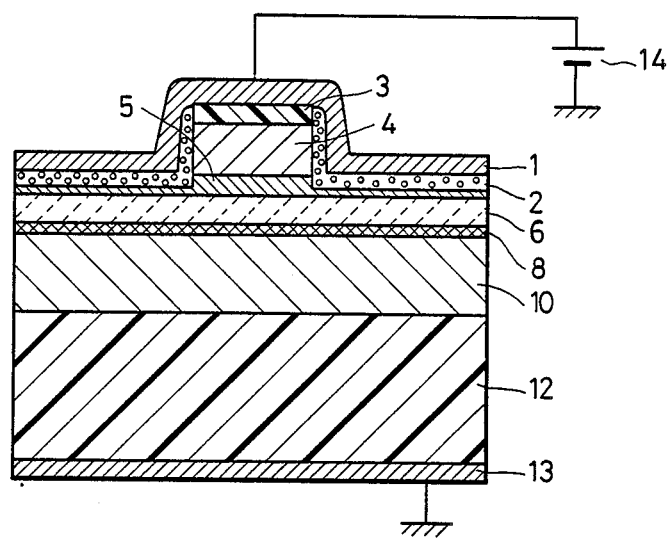
FIGS. 8 and 9 are cross-sectional views showing other concrete configurational examples of semiconductor lasers of the present invention.

FIG. 8 is another configurational example of the present invention in which etching is performed up to a mid-section of the optical waveguide layer.

Since the light intensity distribution draws the waveguide layer region as well, the effect of the present invention can be sufficiently achieved even in such a case.

The current recombination layer 8 and the optical waveguide layer 5 were configured in the double-hetero structure of a GaAs/AlGaAs system. In the present embodiment, the recombination layer 8 consists of GaAs 0.05 μm thick, the optical waveguide layer 5 consists of $Al_{0.1}Ga_{0.9}As$ 0.1 μm thick and the clad layers 4, 6 and 10 consist of $Al_{0.3}Ga_{0.7}As$, and the layer 6 is 0.6 μm thick.

Further, the clad layers 4, 6 and 10 may consist of $Al_{0.3}Ga_{0.7}As$, $Al_{0.4}Ga_{0.6}As$ and $Al_{0.5}Ga_{0.5}As$, or $Al_{0.4}Ga_{0.6}As$, $Al_{0.3}Ga_{0.7}As$ and $Al_{0.4}Ga_{0.6}As$ so that each layer has a different mixed crystal ratio.

Figure 9:
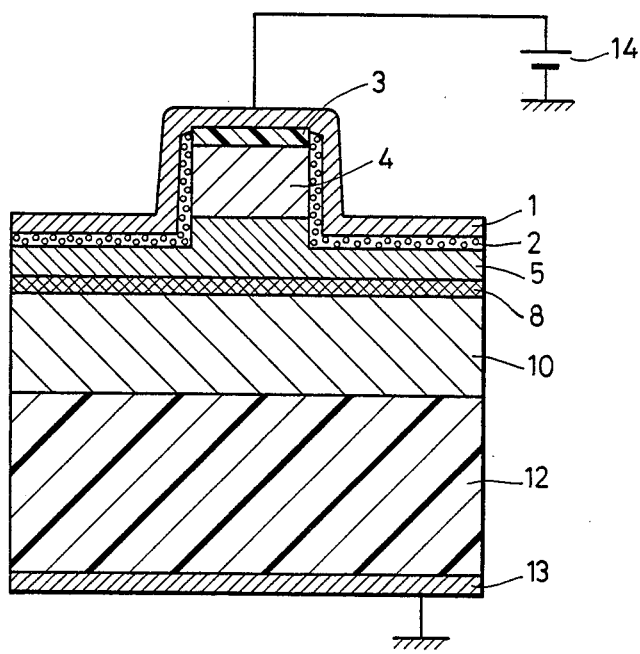

FIG. 9 shows still another configurational example of the present invention, in which no clad layer is inserted between the recombination layer and the optical waveguide layer.

The upper clad layer 4 consists of p-$Al_{0.4}Ga_{0.6}As$, the optical waveguide layer 5 consists of p-$Al_{0.3}Ga_{0.7}As$ 0.7 μm thick, the recombination layer 8 consists of p-GaAs 0.05 μm thick and the lower clad layer 10 consists of n-$Al_{0.4}Ga_{0.6}As$.

In this case, the ridge processing should be stopped within the optical waveguide. A far field pattern having a nearly perfect circle can also be obtained, and the limit of light output level can also be increased.

Further, there is no problem in applying the present invention even when the layers of the semiconductor laser are reversed relative to up and down, and p and n.

It will be also noted that in FIGS. 8 and 9, like components as in FIG. 5A are indicated by like numerals, and detailed explanation was omitted.

As explained above, in the ridge waveguide-type semiconductor laser, by forming the optical waveguide layer over the current recombination layer, and performing mesa-etching processing up to near the optical waveguide layer, it has become possible to improve refractive index wave-guiding characteristics, to obtain a far field pattern which is small and which has the shape of a perfect circle with little astigmatism, and further to provide a high output.

Various applications of the present invention other than the embodiments explained above are possible. For example, materials for constituting the semiconductor laser are not limited to GaAs/AlGaAs system. Various systems, such as InP/InGaAsP system or the like, can also be used. The scope of the present invention should, therefore, be determined by reference to the appended claims.

What is claimed is:

1. In a semiconductor laser, an operative structure comprising:
   a substrate;
   a current recombination layer formed on said substrate, said recombination layer generating light by recombining injected current;
   an optical waveguide layer formed on said recombination layer across a width of said recombination layer and having a layer thickness, the light generated at said recombination layer being coupled to said optical waveguide layer, and at least a part of said optical waveguide layer being removed by etching in the direction of the layer thickness, at two opposing side regions up to a central region in the direction of the width of the recombination layer, in order to form a belt-like projection;
   a separation layer which is provided between said recombination layer and said optical waveguide layer, and which has a lower refractive index than refractive indices of said recombination layer and said optical waveguide layer; and
   a pair of electrodes for providing current to said combination layer, said electrodes being mounted to respective surfaces of the laser.

2. A semiconductor laser according to claim 1, wherein said recombination layer has a refractive index which is substantially equal to that of said optical waveguide layer.

3. A semiconductor laser according to claim 1, wherein said recombination layer has a refractive index slightly higher than that of said optical waveguide layer.

4. A semiconductor laser according to claim 1, wherein said optical waveguide layer is completley removed at both said opposed side regions in the direction of the layer thickness.

5. A semiconductor laser according to claim 1, wherein the width of said belt-like projection is set so that a far field pattern of the light which the laser emits is nearly circular.

6. A semiconductor laser according to claim 1, wherein said projection includes an apex region and one of said electrodes electrically contacts only said apex region of said projection.

7. A semiconductor laser according to claim 1 further comprising:
   a first clad layer provided between said substrate and said recombination layer; and
   a second clad layer provided on said optical waveguide layer;
   said first and second clad layers having refractive indices lower than those of said recombination layer and said optical waveguide layer.

8. A semiconductor laser according to claim 7 further comprising:
   a buffer layer provided between said substrate and and first clad layer.

9. A semiconductor laser according to claim 7 further comprising:

a cap layer provided on said second clad layer.

10. A semiconductor laser according to claim 1 further comprising:
first and second light-confining layers adjacent to and respectively provided over and under said recombination layer.

11. A semiconductor laser according to claim 1, wherein said recombination layer has a multi-quantum-well structure.

12. A semiconductor laser according to claim 1, wherein said optical waveguide layer has a multi-quantium-well structure.

13. A semiconductor laser according to claim 1, wherein said recombination layer and said optical waveguide layer are formed by GaAs and AlGaAs, respectively.

14. A semiconductor laser according to claim 1 further comprising:
a power supply connected to said electrodes.

15. A semiconductor laser according to claim 1, wherein said recombination layer has a refractive index which is higher than that of said optical waveguide layer.

16. In a semiconductor laser, an operative structure comprising:
a substrate;
a current recombination layer formed on said substrate, said recombination layer generating light by recombining injected current;
an optical waveguide layer formed on and in contact with said recombination layer across a width of said recombination layer and a layer thickness, the light generated at said recombination layer being coupled to said optical waveguide layer, and at least a part of said optical waveguide layer being removed by etching in the direction of the layer thickness, at two opposing side regions up to a central region in the direction of the width of the recombination layer, in order to form a belt-like projection; and
a pair of electrodes for providing current to said recombination layer, said electrodes being mounted to respective surfaces of the laser.

17. A semiconductor laser according to claim 16, wherein the width of said belt-like projection is set so that a far field pattern of the light which the laser emits is nearly circular.

18. A semiconductor laser according to claim 16, wherein said belt-like projection includes an apex region, and one of said electrodes electrically contacts only said apex region of said projection.

19. A semiconductor laser according to claim 16 further comprising:
a first clad layer provided between said substrate and said recombination layer; and
a second clad layer provided on said optical waveguide layer;
said first and second clad layers having refractive indices lower than those of said recombination layer and said optical waveguide layer.

20. A semiconductor laser according to claim 19 first comprising:
a cap layer provided on said second clad layer.

21. A semiconductor laser according to claim 16, wherein said recombination layer and said optical waveguide layer are formed of GaAs and AlGaAs, respectively.

22. A semiconductor laser according to claim 16 further comprising:
a power supply connected to said electrodes.

* * * * *

UNITED STATES PATENT AND TRADEMARK OFFICE
CERTIFICATE OF CORRECTION

PATENT NO.   : 4,896,328
DATED        : January 23, 1990
INVENTOR(S)  : YOSHINOBU SEKIGUCHI ET AL.

It is certified that error appears in the above-identified patent and that said Letters Patent is hereby corrected as shown below:

COLUMN 1

Line 46, "small" should read --smaller-- and "region $X_R$" should read --region where $X_R$--.

COLUMN 6

Line 32, "combination layer," should read --recombination layer,--.
    Line 43, "completley" should read --completely--.

COLUMN 7

Line 12, "tium-well" should read --tum-well--.

COLUMN 8

Line 26, "first" should read --further--.

Signed and Sealed this

Eighteenth Day of February, 1992

*Attest:*

HARRY F. MANBECK, JR.

*Attesting Officer*    *Commissioner of Patents and Trademarks*